United States Patent [19]

Christensen

[11] Patent Number: 5,753,908
[45] Date of Patent: May 19, 1998

[54] PHOTOELECTRIC IMAGING DEVICE PHOTOSENSOR ARRAY ALIGNMENT APPARATUS AND METHOD

[75] Inventor: Michael L. Christensen, Windsor, Colo.

[73] Assignee: Hewlett-Packard Company, Palo Alto, Calif.

[21] Appl. No.: 780,912

[22] Filed: Jan. 9, 1997

[51] Int. Cl.[6] .................................................. H01J 5/02
[52] U.S. Cl. ........................... 250/239; 250/216; 250/208.1
[58] Field of Search ............................... 250/239, 208.1, 250/235, 236, 216; 358/482, 483, 493, 494; 369/112

[56] References Cited

U.S. PATENT DOCUMENTS

| | | | |
|---|---|---|---|
| 2,880,267 | 3/1959 | Goldmark et al. | 250/226 |
| 3,091,694 | 5/1963 | Goodridge | 250/239 |
| 4,457,017 | 6/1984 | Onogi et al. | 250/239 |
| 4,709,144 | 11/1987 | Vincent | 250/226 |
| 4,792,674 | 12/1988 | Hirano | 250/216 |
| 4,806,750 | 2/1989 | Vincent | 250/226 |
| 4,855,818 | 8/1989 | Morimoto et al. | 358/75 |
| 4,859,847 | 8/1989 | Matsuno et al. | 250/239 |
| 4,870,268 | 9/1989 | Vincent et al. | 250/226 |
| 4,926,041 | 5/1990 | Boyd | 250/226 |
| 5,018,808 | 5/1991 | Myers et al. | 350/6.91 |
| 5,019,703 | 5/1991 | Boyd et al. | 250/208.1 |
| 5,032,004 | 7/1991 | Steinle | 350/171 |
| 5,040,872 | 8/1991 | Steinle | 359/638 |
| 5,044,727 | 9/1991 | Steinle | 350/171 |
| 5,122,911 | 6/1992 | Kuo | 359/889 |
| 5,151,887 | 9/1992 | Miyazaki | 369/44.32 |
| 5,227,620 | 7/1993 | Elder, Jr. et al. | 250/208 |
| 5,241,174 | 8/1993 | Ando | 250/235 |
| 5,315,111 | 5/1994 | Burns et al. | 250/235 |
| 5,373,437 | 12/1994 | Itoh et al. | 364/44.32 |
| 5,387,789 | 2/1995 | Ota | 250/201.7 |
| 5,410,347 | 4/1995 | Steinle et al. | 348/270 |

FOREIGN PATENT DOCUMENTS

| | | | |
|---|---|---|---|
| 1-147956 | 6/1989 | Japan | H04N 1/04 |
| 2-277374 | 11/1990 | Japan | H04N 1/06 |
| 4-81068 | 3/1992 | Japan | H04N 1/04 |

*Primary Examiner*—Stephone B. Allen

[57] ABSTRACT

An apparatus and method for achieving alignment of a photosensor array in an imaging device is disclosed. The photosensor array is mounted in an integrated circuit package having a plurality of downwardly extending leads. The leads are received in a plurality of sockets which are attached to and extend through the retina board. A pair of holes are provided extending through the retina board proximate the ends of the integrated circuit package. An actuator, such as a screw, is associated with each hole such that the actuator is able to contact the rear surface of the integrated circuit package. In this manner, one of the actuators may be used to apply a force to one end of the integrated circuit package in order to move that end away from the retina board and thus achieve alignment with the light beam. After the desired alignment has been achieved, some of the integrated circuit package leads may be soldered within their respective sockets in order to lock the integrated circuit package and photosensor array in place. Alternatively, some of the sockets may be omitted such that the corresponding integrated circuit package leads may be soldered directly to the retina board in order to lock the package in place.

21 Claims, 4 Drawing Sheets

PHOTOELECTRIC IMAGING DEVICE PHOTOSENSOR ARRAY ALIGNMENT APPARATUS AND METHOD

FIELD OF THE INVENTION

The present invention relates generally to photoelectric imaging devices and, more particularly, to a photosensor array mounting device which allows for alignment of the photosensor array relative to the remainder of a photoelectric imaging device.

BACKGROUND OF THE INVENTION

Photoelectric imaging devices are used to produce machine-readable data which is representative of the image of an object, e.g. a page of printed text. As used herein, the phrase "photoelectric imaging device" means any device which generates data representative of an imaged object through use of a photosensor array such as a charge coupled device (CCD). Photoelectric imaging devices include devices such as camcorders and digital cameras which instantaneously focus an entire image which is to be captured onto a two dimensional photosensor array. Photoelectric imaging devices also include line-focus systems which image an object by sequentially focusing narrow "scan line" portions of the object onto a linear photosensor array by sweeping a scanning head over the object. Such devices, commonly referred to as optical scanners include computer input devices usually referred to simply as "scanners" as well as facsimile machines and digital copy machines.

In a line-focus system, a light beam from an illuminated line object is imaged by a lens on a linear photosensor array which is positioned remotely from the line object. The linear photosensor array is a single dimension array of photoelements which correspond to small area locations on the line object. These small area locations on the line object are commonly referred to as "picture elements" or "pixels." In response to light from its corresponding pixel location on the line object, each photosensor pixel element in the linear photosensor array (sometimes referred to simply as "pixels") produces a data signal which is representative of the light intensity that it experiences during an immediately preceding interval of time known as a sampling interval. All of the photoelement data signals are received and processed by an appropriate data processing system.

In a color optical scanner, a plurality of spectrally separated imaging beams (typically red, green and blue beams) must be projected onto one or more photosensor arrays. Some color optical scanners employ beam splitter devices for spectrally separating an imaging light beam into color component beams. These separate color component beams are projected onto separate linear photosensor arrays. Other optical scanners project color component images on a single linear array in a series of separate scanning passes.

The construction and operation of optical scanners employing photosensor arrays are fully disclosed in U.S. patent application Ser. No. 08/405,116 filed on Mar. 16, 1995, now U.S. Pat. No. 5,646,394, of Steinle et al. for IMAGING DEVICE WITH BEAM STEERING CAPABILITY and in the following U.S. Pat. Nos. 4,870,268 of Vincent et al. for COLOR COMBINER AND SEPARATOR AND IMPLEMENTATIONS; 4,926,041 of Boyd for OPTICAL SCANNER (and corresponding EPO patent application no. 90306876.5 filed Jun. 22, 1990); U.S. Pat. No. 5,019,703 of Boyd et al. for OPTICAL SCANNER WITH MIRROR MOUNTED OCCLUDING APERTURE OR FILTER (and corresponding EPO patent application no. 90312893.2 filed Nov. 27, 1990); U.S. Pat. No. 5,032,004 of Steinle for BEAM SPLITTER APPARATUS WITH ADJUSTABLE IMAGE FOCUS AND REGISTRATION (and corresponding EPO patent application no. 91304185.1 filed May 9, 1991); U.S. Pat. No. 5,044,727 of Steinle for BEAM SPLITTER/COMBINER APPARATUS (and corresponding EPO patent application no. 91303860.3 filed Apr. 29, 1991); U.S. Pat. No. 5,040,872 of Steinle for BEAM SPLITTER/COMBINER WITH PATH LENGTH COMPENSATOR (and corresponding EPO patent application no. 90124279.2 filed Dec. 14, 1990 which has been abandoned); U.S. Pat. No. 5,227,620 of Elder, Jr. et al. for APPARATUS FOR ASSEMBLING COMPONENTS OF COLOR OPTICAL SCANNERS (and corresponding EPO patent application no. 91304403.8 file May 16, 1991); and U.S. Pat. No. 5,410,347 of Steinle et al. for COLOR OPTICAL SCANNER WITH IMAGE REGISTRATION HOLDING ASSEMBLY, which are all hereby specifically incorporated by reference for all that is disclosed therein.

In imaging devices and particularly the line-focus system described above, it is imperative for accurate imaging that the light beam from the object be accurately aligned with the photosensor array. This alignment is generally accomplished during the manufacture of the imaging device and usually is performed as one of the final steps in the manufacturing process.

Figure 5:
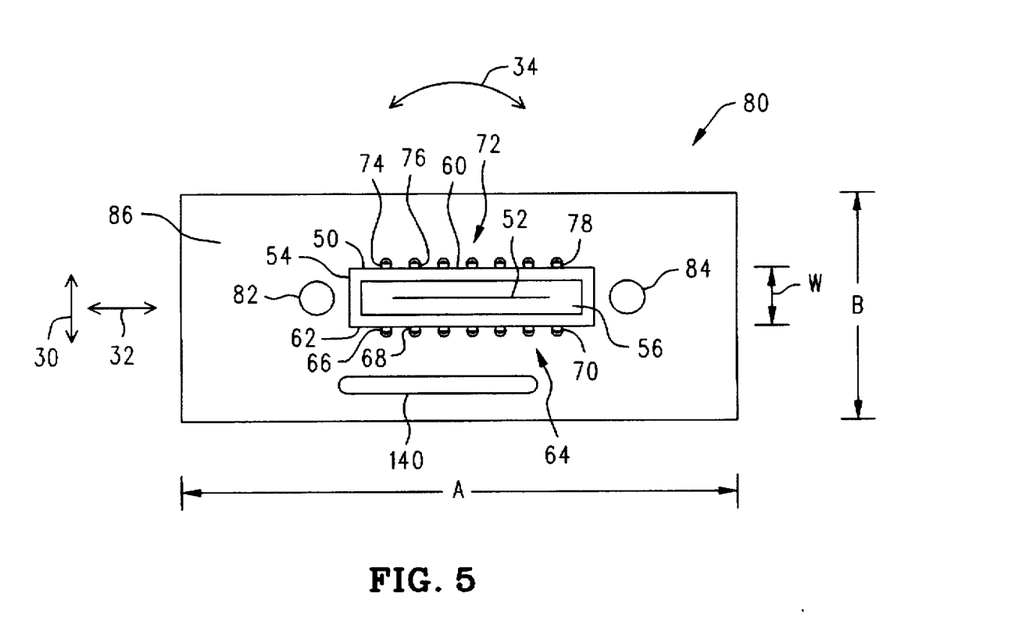
FIG. 5 is a front elevation view of the printed circuit board and integrated circuit package of FIG. 4 in an assembled configuration.

In order to achieve alignment, a photosensor array must be aligned in several degrees of freedom. Referring to FIG. 5, for example, it can be appreciated that a linear photosensor array 52 must be aligned in a first 30, a second 32, and a third 34 degree of freedom.

Figure 1:
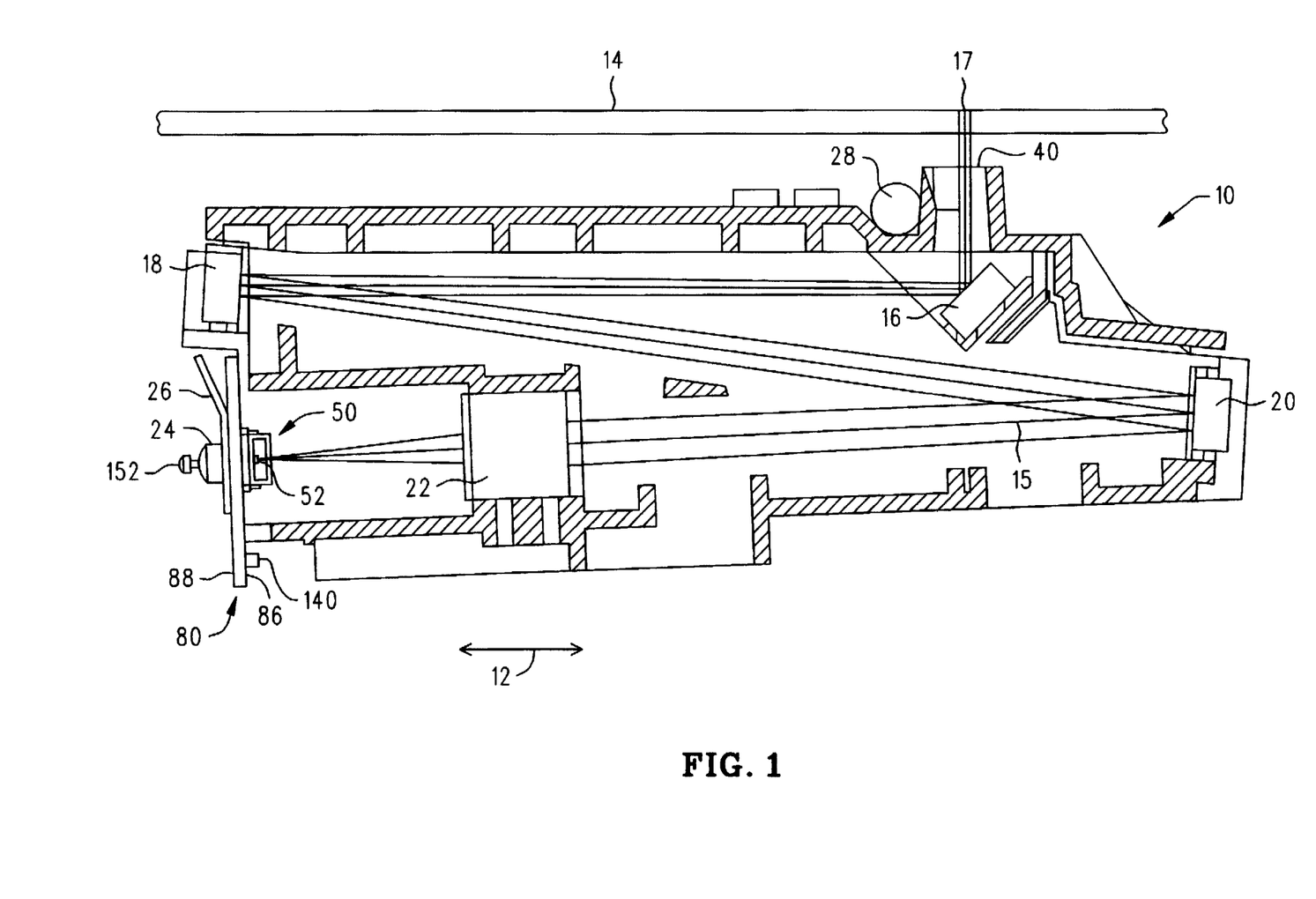
FIG. 1 is a cross-sectional view showing the optical path of an optical scanning carriage.

Referring to FIG. 1, it can be seen that a retina board 80, upon which the linear photosensor array 52 is mounted, may be attached to a scanning carriage 10 via screws 24 (only one shown). Referring again to FIG. 5, it can be seen that the screws 24 pass through a pair of oversize holes 82, 84. These oversize holes allow the retina board 80 to move relative to the scanning carriage 10 before the screws 24 are tightened and thus allow adjustment for the first through third degrees of freedom 30, 32 and 34 discussed above.

Figure 6:
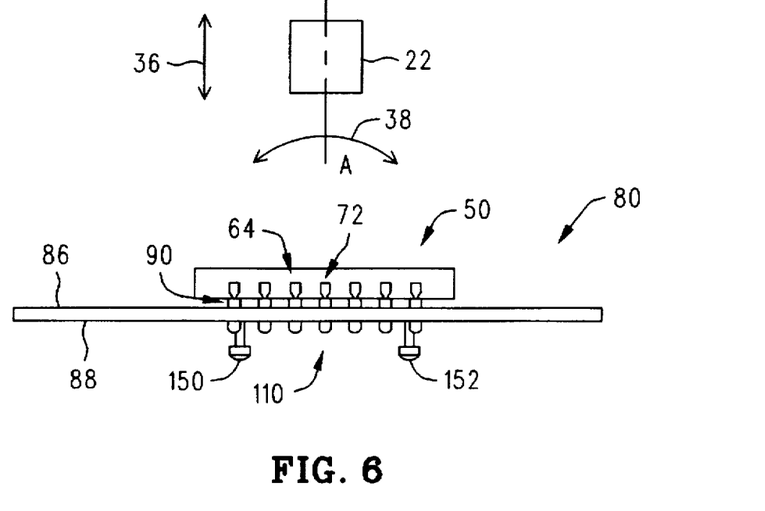
FIG. 6 is a top plan view of the printed circuit board and integrated circuit package of FIG. 4 in an assembled configuration.

Referring to FIG. 6, it can be seen that adjustment of the focus between the lens 22 and the photosensor array 52 is also required. This focus adjustment may generally be made in a conventional manner by moving the lens 22 in a fourth degree of freedom 36, as shown.

Referring again to FIG. 6, it can be seen that an adjustment in a fifth degree of freedom 38 is also required in order to achieve proper alignment between the photosensor 52 and the light beam. Proper alignment in the fifth degree of freedom 38 requires that the photosensor array be oriented at substantially a right angle with respect to the lens central axis AA. If the photosensor array 52 is not aligned in the fifth degree of freedom 38, then one end of the array will be too close to the lens 22 and the other end of the array will be too far from the lens. Thus, while the center of the array may be in proper focus, both of the ends will be out of focus when the photosensor array 52 is improperly aligned with the light beam. Prior solutions to achieving alignment in the fifth degree of freedom have presented problems.

One solution, for example, entails mounting the retina board 50 on a bracket that pivots and is locked with either a screw or glue. Because the weight of the entire retina board must be supported, however, such a bracket must be relatively large in order to resist shock forces. A large bracket adds considerable expense to and increases the size of a scanning carriage. Also, because the entire retina board pivots, a portion of the retina board must necessarily move out of contact with the scanning carriage. An additional cover may, thus, be required, in order to prevent light from entering through the resulting opening between the retina board and the carriage. A bracket, as described above, thus, adds weight and cost to a scanning carriage and degrades its performance.

Another solution is to provide a smaller lens having an increased depth of field. If the depth of field is increased sufficiently, then adjustment in the fifth degree of freedom may not be necessary. It has been found, however, that using such a smaller lens compromises the speed at which the scanner may operate.

Another solution is to mount the photosensor array in a flex circuit to allow alignment and then use glue to lock the array in place once aligned. Flex circuits, however, are relatively expensive. Further, the use of glue has been found to represent an expensive and error prone process.

Thus, it would be generally desirable to provide an apparatus and method which overcomes these problems associated with alignment of a photosensor array in the fifth degree of freedom, as described above.

SUMMARY OF THE INVENTION

The present invention is directed to an apparatus and method for achieving alignment of a photosensor array in an imaging device. The photosensor array is mounted in an integrated circuit package having a plurality of downwardly extending leads. The leads are received in a plurality of sockets which are attached to and extend through the retina board. The sockets are spring-loaded in order to firmly retain the integrated circuit package leads and yet allow movement of the leads relative to the sockets.

A pair of holes are provided extending through the retina board proximate the ends of the integrated circuit package. An actuator, such as a screw, is associated with each hole such that the actuator is able to contact the rear surface of the integrated circuit package. In this manner, one of the actuators may be used to apply a force to one end of the integrated circuit package in order to move that end away from the retina board and thus achieve alignment with the light beam.

After the desired alignment has been achieved, some or all of the integrated circuit package leads may be soldered within their respective sockets in order to lock the integrated circuit package and photosensor array in place. Alternatively, some of the sockets may be omitted such that the corresponding integrated circuit package leads may be soldered directly to the retina board in order to lock the package in place.

DETAILED DESCRIPTION OF THE INVENTION

FIGS. 1–7, in general, illustrate a method for aligning a photosensor array 52 with at least a portion of an imaging subassembly 16, 18, 20, 22. The method includes the steps of providing a substantially planar board member 80 having a first surface 86 and an oppositely disposed second surface 88; providing a package 50 containing the photosensor array 52; providing the package 50 located adjacent the first surface 86 of the board member 80; providing a hole 120, 130 through the board member 80 adjacent a first portion of the package 50; providing an actuator 150, 152 extending through the hole 82, 84; and moving the first portion of the package 50 away from the first surface 86 of the board member 80 by contacting the first portion of the package with the actuator 150, 152.

FIGS. 1–7 also illustrate, in general, a device for aligning a photosensor array 52 with at least a portion of an imaging subassembly 16, 18, 20, 22. The device includes a substantially planar board member 80 having a first surface 86 and an oppositely disposed second surface 88; a package 50 containing the photosensor array 52, the package 50 located adjacent the first surface 86 of the board member 80; a hole 120, 130 extending through the board member 80 adjacent a first portion of the package 50; and an actuator 150, 152 extending through the hole 120, 130.

Having thus described the alignment of the photosensor array in general, the method and apparatus will now be described in further detail.

FIG. 1 illustrates a reciprocal carriage 10 which may be used, for example, in connection with an optical scanning device of a type adapted to produce machine readable data representative of a color image of an object which is scanned. The machine readable data produced by the optical scanning device is adapted to be received and used by a digital computer in a conventional manner, e.g. the data may be stored on a computer memory device or may be used to produce a color display of the object on a CRT or a color electrostatic print, etc.

During operation of the optical scanning device, the carriage 10 may reciprocate beneath a glass platen 14 in the directions illustrated by the arrow 12. The carriage includes a plurality of optical components for transmitting a light beam 15 which is representative of a line image of an object, such as a document. The light beam 15 originates at a moveable scan line area 17 located on the object being scanned and then passes through a scan line opening 40 formed in the carriage 10. After entering the carriage 10, the light beam is transmitted by the optical components to a photosensor array 52. The carriage 10 may also include a light source 28 in a conventional manner, in order to illuminate the scan line area 17 of the object being scanned.

Specifically, the optical components located in the carriage 10 may include a plurality of mirrors 16, 18 and 20 and a lens 22, as shown. The photosensor array 52 may be housed within an integrated circuit package 50 in a conventional manner. The integrated circuit package 50 may, in turn, be mounted to a printed circuit board 80, in a manner as will be described in further detail herein.

Figure 2:
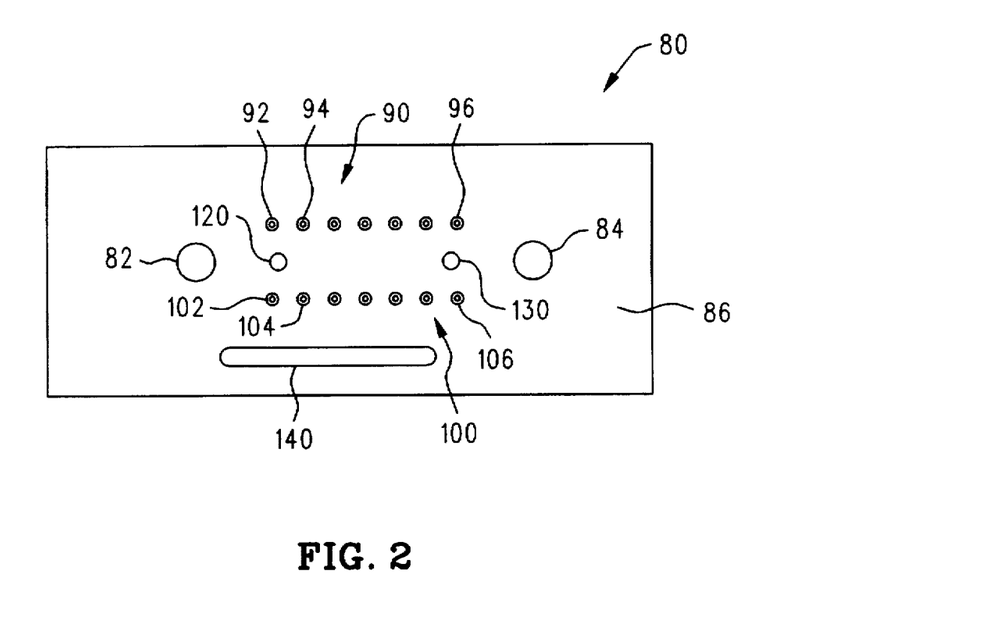
FIG. 2 is a front elevation view of a printed circuit board used in conjunction with the optical scanning carriage of FIG. 1.
Figure 3:
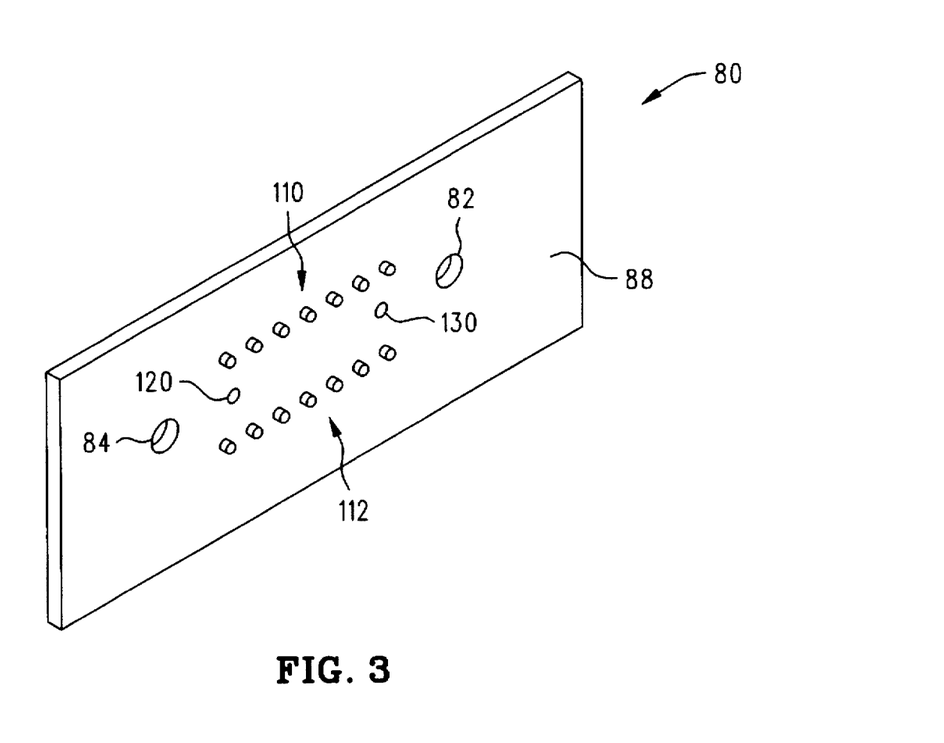
FIG. 3 is a rear perspective view of the printed circuit board of FIG. 2.

The printed circuit board 80 may be attached to the remainder of the carriage 10 via a pair of screws 24 (only one is shown) which pass through a pair of oversized holes 82, 84 in the printed circuit board 80, FIGS. 2, 3 and 5. The printed circuit board 80 has a first surface 86, FIGS. 1, 2, 4 and 5, which faces the interior of the carriage 10 and a second surface 88, FIGS. 1, 3 and 4, which is oppositely disposed relative to the first surface 86. A spacer bar 26, FIG. 1, may be provided between the printed circuit board second surface 88 and the heads of the screws 24, as shown. The spacer bar 26 serves to isolate the heads of the screws 24 from the printed circuit board second surface 88 so that the rotary motion of the screw heads is not transmitted to the printed circuit board when the screws 24 are tightened. In this manner, alignment of the printed circuit board 80 may be maintained while the screws 24 are tightened.

FIGS. 2–5 illustrate the printed circuit board 80 in greater detail. As previously described, the board 80 may include a pair of through-holes 82, 84 to accommodate attachment of the board 80 to the scanning carriage 10. As shown, for example in FIG. 2, printed circuit board 80 may also include a first row of sockets 90, such as the individual sockets 92, 94 and 96. Printed circuit board 80 may also include a second row of sockets 100, such as the individual sockets 102, 104 and 106. The sockets 90, 100 each may generally comprise a hollow cylindrical member which may extend completely through the board 80. Each of the sockets may be soldered to the rear surface 88 of the board 80 in order to discretely connect the socket with other electrical components contained on the board 80. Referring to FIG. 3, it can be seen that, on the rear surface 88 of printed circuit board 80, a plurality of solder bumps 110 correspond to the sockets 90 and a plurality of solder bumps 112 correspond to the sockets 100.

Figure 4:
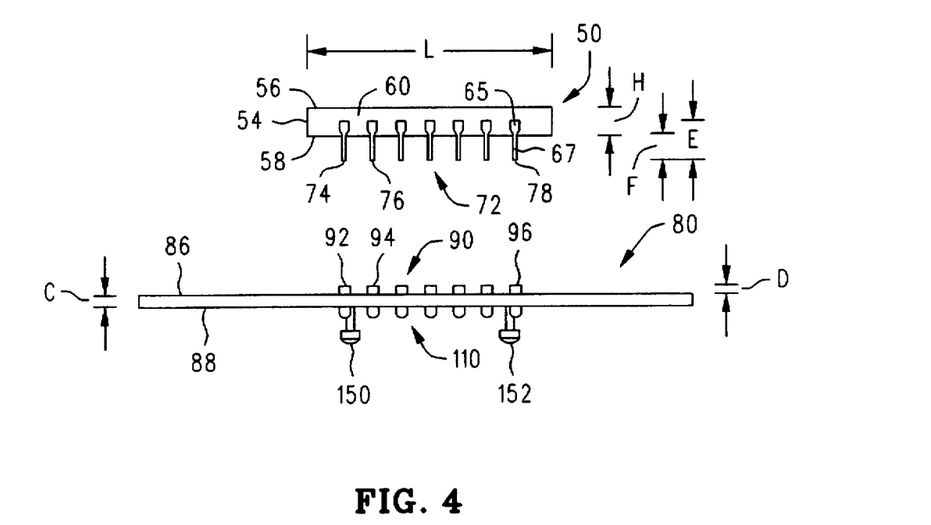
FIG. 4 is a top plan view of the printed circuit board of FIG. 2 and an associated integrated circuit package in an un-assembled configuration.

Each of the sockets 90, 100 may extend above the front surface 86 of the printed circuit board 80 by a distance "D" of about 0.8 mm, as shown in FIG. 4, and may have a-depth of about 4.2 mm. The sockets 90, 100 each contain a spring-loaded retention member adapted to releasably grasp a connection pin of an integrated circuit device in a conventional manner. The sockets 90, 100, mounted as described above, embody what is commonly known in the industry as a "Pins in Carrier Type I.C. Socket". The sockets 90, 100 may be of the type commercially available from McKenzie Technology of 910 Page Avenue, Fremont, Calif. 94538 and sold as #PPC-DIP-422-620C or of the type commercially available from Mill-Max Manufacturing Corp. of 190 Pine Hollow Road, P.O. Box 300, Oyster Bay, N.Y. 11771-0300 and sold as #614-93-422-41-001.

Printed circuit board 80 may also include a pair of holes 120, 130 which extend completely through the board as shown in FIGS. 2 and 3. Each of the holes 120, 130 may have a diameter of about 1.35 mm. Referring to FIG. 2, a connector 140 may be provided on the front surface 86 of the printed circuit board 80 in a conventional manner in order to allow the various components located on the printed circuit board 80 to be connected to the remainder of the imaging device.

It is noted that the printed circuit board 80 also includes various electronic components conventionally associated with printed circuit boards, and specifically with retina boards for mounting photosensor arrays. These components, however, have been omitted from the drawings for the sake of clarity.

Printed circuit board 80 may have a length "A" of about 101 mm, a height "B" of about 33.8 mm, FIG. 5, and a thickness "C" of about 2.4 mm, FIG. 4.

FIGS. 4 and 5 illustrate the integrated circuit package 50 in greater detail. With reference to FIG. 5, the package 50 may include a generally parallelepiped-shaped housing 54. The housing 54 may include an upper surface 56 and an oppositely disposed lower surface 58, FIG. 4. Located on or below the upper surface 56, which may be transparent, is the photosensor array 52, FIG. 5. It is noted that, although the photosensor array 52 is illustrated in FIG. 4 as a single line, it may actually comprise a plurality, e.g., three, of linear photosensor arrays.

The housing 54 may also include a pair of oppositely disposed sidewalls 60, 62 as shown in FIG. 5. Extending downwardly from the sidewall 62 are a plurality of pins 64 such as the individual pins 66, 68 and 70. Extending downwardly from the sidewall 60 are a plurality of pins 72 such as the individual pins 74, 76 and 78. With reference, for example, to the pin 78 in FIG. 4, each of the pins 64, 72 may include a relatively thick portion 65 located proximate the housing sidewall 60 or 62 and a relatively thin portion 67 attached to the thick portion 65. The pins 64, 72 serve to electrically connect the photosensor array 52 to the printed circuit board 80 in a conventional manner.

The integrated circuit package 50 may be generally of the type conventionally used to house a photosensor array and to allow such a photosensor array to interface with an underlying printed circuit. Although various sizes and configurations of integrated circuit packages may be used for this purpose, one specific set of dimensions for the integrated circuit package 50 is set forth below by way of example.

Each of the pins 64, 72 may have an overall length "E" of about 5.5 mm, while the thin portion 67 of each pin may have a length "F" of about 3.2 mm, FIG. 4. The pins 64, 72 may be located on the integrated circuit package 50 such that they extend for a distance of about 4 mm below the lower surface 58 of the package. The integrated circuit package housing 54 may have a length "L" of about 41.6 mm, a height "H" of about 3.2 mm, FIG. 4, and a width "W" of about 9.65 mm, FIG. 5.

FIG. 6 illustrates the integrated circuit package 50 mounted on the printed circuit board 80. When mounted in this manner, the pins 64 and 72 of the integrated circuit package are received within the sockets 100 and 90, respectively. Each of the pins 64, 72 is grasped by the internal spring members of the sockets 90, 100, as previously described. The contact between the socket spring members and the pins ensures that proper electrical contact is established between each pin and its corresponding socket. In this manner, the integrated circuit package 50 is electrically connected to the printed circuit board 80. The contact between the socket spring members and the pins also serves to hold each pin within its corresponding socket and, thus, physically secures the integrated circuit package 50 to the printed circuit board 80.

When the pins 64, 72 of the integrated circuit package 50 are fully inserted within the sockets 90, 100, as shown in FIG. 6, the bottom of each pin will be close to or actually in contact with the bottom of each socket. Depending upon the exact size and configuration of the integrated circuit package 50, as discussed previously, further downward movement of the integrated circuit package 50 relative to the printed circuit board 80 will be prevented either by the contact between the bottom of each pin 72, 64 and the corresponding bottom of each socket 90, 100 or by contact between the integrated circuit package lower surface 58 and the upper portions of the sockets 90, 100 (i.e., the portions of the sockets 90, 100 which extend above the printed circuit board upper surface 86, FIG. 4).

When an integrated circuit package having the exemplary dimensions set forth above (e.g., having an overall pin length "E" of about 5.5 mm) is used, the bottom of each pin 90, 100 will contact the corresponding bottom of each socket 90, 100 and the lower surface 58 of the integrated circuit package 50 may be spaced about 1.2 mm from the front surface 86 of the printed circuit board 80.

When an integrated circuit package having a shorter pin length "E" is used, the integrated circuit package lower surface 58 may contact the upper portions of the sockets 90, 100 before the pins 72, 64 bottom out in the sockets 90, 100. In this case, the lower surface 58 of the integrated circuit package 50 will be spaced the distance "D", FIG. 4, which may be about 0.8 mm as described previously, from the front surface 86 of the printed circuit board 80.

Referring to FIG. 1, when the integrated circuit package 50 is mounted as described above, the light beam 15 may be directed onto the photosensor array 52 by the scanning carriage optical components, e.g., lens 22 and mirrors 16, 18 and 20 in a manner as previously explained. Accordingly, the photosensor array 52 is able to generate a signal which is representative of the object being scanned. This signal, after passing through the printed circuit board 80, may be further conducted to various other devices via the connector 140, FIG. 5, in a conventional manner.

As previously discussed, in imaging systems such as the one described above, it is imperative for accurate imaging that the light beam 15 be accurately aligned with the photosensor array 52. In order to achieve alignment, the photosensor array 52 must be aligned in several degrees of freedom. Referring to FIG. 5, for example, it can be appreciated that the linear photosensor array 52 must be aligned in a first 30, a second 32, and a third 34 degree of freedom. Referring to FIG. 1, it can be seen that retina board 80, upon which the linear photosensor array 52 is mounted, may be attached to the scanning carriage 10 via screws 24 (only one shown). Referring again to FIG. 5, it can be seen that the screws 24 pass through a pair of oversize holes 82, 84. These oversize holes allow the retina board 80 to move relative to the scanning carriage 10 before the screws 24 are tightened and thus allow adjustment in the first through third degrees of freedom 30, 32 and 34 discussed above.

Referring to FIG. 6, it can be seen that adjustment of the focus between the lens 22 and the photosensor array 52 is also required. This focus adjustment may generally be made in a conventional manner by moving the lens 22 in a fourth degree of freedom 36, as shown in FIG. 6.

Referring to FIG. 5, it can be seen that an adjustment in the fifth degree of freedom 38 is also required in order to achieve proper alignment between the photosensor array 52 and the light beam 15. Proper alignment in the fifth degree of freedom 38 normally requires that the photosensor array be oriented at substantially a right angle with respect to the lens central axis AA. If the photosensor array 52 is not aligned in the fifth degree of freedom 38, then one end of the array will be too close to the lens 22 and the other end of the array will be too far from the lens. Thus, while the center of the array may be in proper focus, both of the ends will be out of focus.

A mechanism for aligning the photosensor array 52 in the fifth degree of freedom 38, as described above, will now be explained. Referring to FIG. 6, a pair of screws 150, 152 may be threadingly engaged within the printed circuit board holes 120, 130, respectively, FIGS. 2 and 3, as shown. For this purpose, the holes 120 and 130 may be provided with threads in a conventional manner. Alternatively, the screws 120 and 130 may be provided as self-tapping screws and the threads in the holes 120 and 130 may be omitted.

Each screw 150, 152 may have an overall length of about 6.3 mm, with a thread pitch of about 0.32 mm. As can be appreciated, when the screws 150, 152 are provided with conventionally directed threads, clockwise rotation (as viewed from the rear surface 88 of the board 80) of each of the screws 150, 152 will result in the screw moving in the linear direction 154, as shown in FIG. 7.

To adjust the photosensor array 52 in the fifth degree of freedom 38, the appropriate screw 150 or 152 may be turned in a clockwise direction until it comes into contact with the lower surface 58 of the integrated circuit package 50. Further rotation of the screw will thereafter cause one side of the package 50 to move away from the printed circuit board 80.

Figure 7:
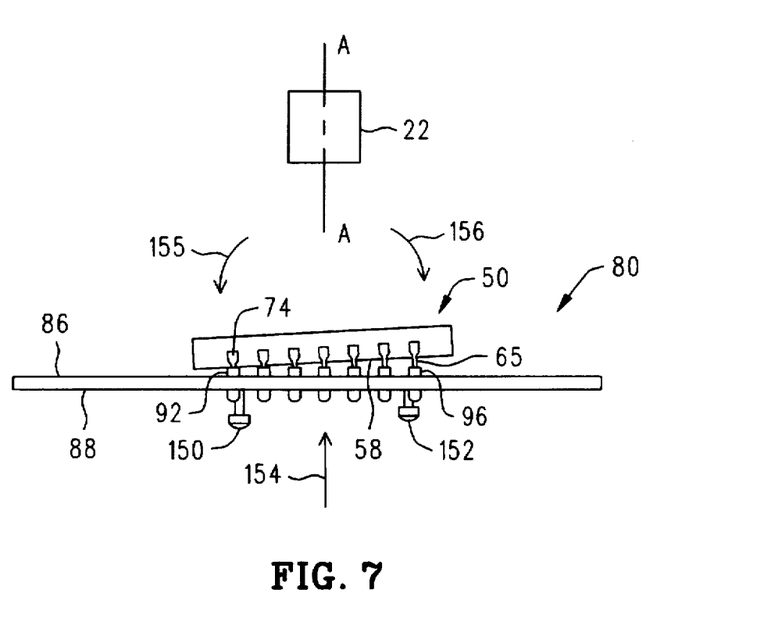
FIG. 7 is a top plan view of the printed circuit board and integrated circuit package of FIG. 6 in which the orientation of the integrated circuit package has been adjusted relative to the printed circuit board.

FIG. 7 illustrates an example of an adjustment as described above. In FIG. 7, the screw 152 has been advanced in order to move the right side, as viewed in FIG. 7, of the package 50 away from the board 80 and, thus, cause the package 50 and attached photosensor array 52 to rotate in the fifth degree of freedom 38 in the direction 155. As can be seen from FIG. 7, this movement has caused the pins toward the right side of the assembly to partially withdraw from their associated sockets. It can be seen, for example, that the pin 65 has partially withdrawn from the socket 96.

In order to rotate the integrated circuit package 50 and attached photosensor array 52 in the opposite direction, i.e., in the direction 156, the screw 150 may advanced, thus causing the left side, as viewed in FIG. 7, of the package 50 to move away from the board 80. As can be appreciated, such movement will cause the pins toward the left side of the assembly, e.g., the pin 74, to partially withdraw from their associated sockets, e.g., the socket 92.

Thus, by selectively rotating the screws 150, 152, the integrated circuit package 50, and the attached photosensor array 52, may be adjusted in the fifth degree of freedom 38 in order to align the photosensor array 52 with the light beam 15.

Although the pins 64, 72 partially withdraw from their respective sockets 100, 90 during the adjustment process, as described above, the pins will remain firmly engaged by the socket spring members. Thus, further movement of the integrated circuit package 50 relative to the printed circuit board 80 is resisted until one of the screws 150, 152 is again advanced. It is noted that the movement of the integrated circuit package 50 relative to the printed circuit board 80 has been exaggerated in FIG. 7 for purposes of illustration. In practice, the maximum distance that the pins 64, 72 would withdraw from the sockets 100, 90 would be only about 0.5 mm.

Because the heads of the screws 150, 152 extend from the rear surface 88 of the printed circuit board 80, they are accessible from the outside of the scanning carriage 10, FIG. 1. This is advantageous in that it allows adjustment of the integrated circuit package 50 in the fifth degree of freedom without the need to dis-assemble the scanning carriage 10.

It is noted that, for the sake of clarity in the drawing figures, only seven pins and sockets per row have been illustrated in conjunction with the integrated circuit package 50 and the printed circuit board 80, respectively. In actuality, the number of pins and sockets may be greater. There may, for example, be eleven pins and sockets per row.

Although adjustment of the photosensor array 52 in the fifth degree of freedom may be carried out at any time, it is preferably accomplished after the adjustments in the first 30, second 32, third 34 and fourth 36 degrees of freedom have been completed. These first-fourth adjustments may be made in any conventional manner.

Using the adjustment screws and integrated circuit mounting arrangement set forth above, the photosensor 52 may be aligned using any conventional alignment technique. As an example of one such technique, the entire scanning carriage 10 may be placed into an alignment fixture such that the carriage scan line opening 40, FIG. 1, is positioned adjacent a target. The target may then be illuminated so that a light beam representative of the target is directed by the scanning carriage optical components 16, 18, 20 and 22 onto the photosensor array 52. The printed circuit board connector 140, FIGS. 1 and 5, may be connected to a monitoring device such that the image of the target generated by the photosensor array 52 may be analyzed. If the sides of the image are out of focus, indicating that the photosensor array 52 is improperly aligned in the fifth degree of freedom, then an appropriate adjustment may be made, as previously explained, by turning the appropriate screw 150 or 152 until the photosensor array 52 is properly aligned. The analysis of the image, as discussed above, may be manually performed, i.e., a human operator may view the image on a display and determine the required adjustment. Alternatively, a computer may perform or assist in performing this analysis in a conventional manner.

It is noted that, although the use of screws 150, 152 has been described in association with the adjustment method and apparatus set forth above, any type of actuator may alternatively be used to push the integrated circuit package 50 away from the printed circuit board 80 in order to achieve alignment of the photosensor array 52. One example of such an actuator is a pneumatic linear actuator which may be incorporated as part of an alignment fixture, such as that described above. Such a linear actuator may be extended through the appropriate hole 120 or 130 in the printed circuit board 80 in order to contact the rear surface 58 of the integrated circuit package 50. In this manner, the actuator may be used to align the photosensor array.

After the proper adjustment is made and the photosensor array is properly aligned in the fifth degree of freedom, as described above, the integrated circuit package 50 may be locked in place with respect to the printed circuit board 80. This locking will ensure that the photosensor array 52 remains aligned even if the carriage 10 is subjected to bumps or other shock loads during transport and use thereof.

This locking may be accomplished, for example, by placing solder paste in some or all of the sockets 90, 100 before the integrated circuit package 50 is inserted. After alignment is completed, heat may be applied to the solder bumps 110, 112 to cause the solder paste contained in the sockets to reflow and lock the integrated circuit package pins 72, 64 in place within the sockets 90, 100, respectively. Although solder paste may be placed in all of the sockets 90, 100 as described above, it is preferable to only place the solder paste in some of the sockets. Most preferably, the solder paste is placed only in the corner sockets 92, 96, 102 and 106, FIG. 2.

As an alternative to placing solder paste in some or all of the sockets 90, 100, as described above, some of the sockets may be omitted entirely, thus allowing the corresponding integrated circuit package pins to be soldered directly to the rear surface 88 of the board 80 in order to lock the integrated circuit package in place. Preferably, in this alternative, the corner sockets 92, 96, 102 and 106 may be omitted and the pins 74, 78, 66 and 70 soldered directly to the printed circuit board rear surface 88.

It is noted that, although the alignment apparatus and method has been described in association with an exemplary scanning carriage, this alignment apparatus and method may be used with various other types of photoelectric imaging applications.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A method for aligning a photosensor array with at least a portion of an imaging subassembly, comprising the steps of:

(a) providing a substantially planar board member having a first surface and an oppositely disposed second surface;

(a) providing a package containing said photosensor array;

(b) providing said package located adjacent said first surface of said board member;

(c) providing a hole through said board member adjacent a first portion of said package;

(d) providing an actuator extending through said hole; and (e) moving said first portion of said package away from said first surface of said board member by contacting said first portion of said package with said actuator.

2. The method of claim 1 wherein said photosensor array is a linear photosensor array.

3. The method of claim 2 wherein said package contains a plurality of linear photosensor arrays.

4. The method of claim 1 wherein said board member is a printed circuit board.

5. The method of claim 1 including the further step of providing a second hole through said board member adjacent a second portion of said package.

6. The method of claim 1 wherein said actuator comprises a threaded member.

7. The method of claim 6 wherein said threaded member is threadingly engaged within said hole.

8. The method of claim 7 wherein said step of contacting said first portion of said package with said actuator includes the step of rotating said threaded member.

9. The method of claim 1 wherein said board member is mounted to an optical scanning device carriage assembly such that said photosensor array is substantially inaccessible.

10. The method of claim 1 wherein said board member includes a plurality of sockets attached thereto, said package includes a plurality of pins extending therefrom, and at least a plurality of said pins are releasably received within said sockets.

11. The method of claim 10 including the further step of providing solder paste in at least some of said sockets.

12. The method of claim 11 including the further step of heating said solder paste after said step of moving said first portion of said package.

13. The method of claim 10 including the further step of soldering at least one of said pins to said board member after said step of moving said first portion of said package.

14. A device for aligning a photosensor array with at least a portion of an imaging subassembly, said device comprising:

(a) a substantially planar board member having a first surface and an oppositely disposed second surface;

(b) a package containing said photosensor array, said package located adjacent said first surface of said board member;

(c) a hole extending through said board member adjacent a first portion of said package; and (d) an actuator extending through said hole.

15. The device of claim 14 wherein said photosensor array is a linear photosensor array.

16. The device of claim 15 wherein said package contains a plurality of linear photosensor arrays.

17. The device of claim 14 wherein said board member is a printed circuit board.

18. The device of claim 14 wherein said board member includes a second hole extending through said board member adjacent a second portion of said package.

19. The device of claim 14 wherein said actuator comprises a threaded member.

20. The device of claim 19 wherein said threaded member is threadingly engaged within said hole.

21. The device of claim 14 wherein said board member is mounted to an optical scanning carriage assembly such that said photosensor array is substantially inaccessible.

* * * * *

UNITED STATES PATENT AND TRADEMARK OFFICE
CERTIFICATE OF CORRECTION

PATENT NO.    : 5,753,908　　　　　　　　　　　　　　　　　　Page 1 of 1
DATED         : May 19, 1998
INVENTOR(S)   : Michael L. Christensen It is certified that error appears in the above-identified patent and that said Letters Patent is hereby corrected as shown below:

Column 5,
Line 35, "a-depth" should read -- a depth --

Column 1,
Line 28, "scanners" should read -- scanners, --

Column 7,
Line 14, "mm" should read -- mm, --

Claims,
Column 10,
Lines 19-27, "(a)" should read "(b)" and rest should change accordingly Signed and Sealed this Thirtieth Day of October, 2001

Attest:

NICHOLAS P. GODICI
*Attesting Officer*　　*Acting Director of the United States Patent and Trademark Office*